(12) United States Patent
Kawai et al.

(10) Patent No.: US 7,383,693 B2
(45) Date of Patent: Jun. 10, 2008

(54) COOLING DEVICE

(75) Inventors: Masahiro Kawai, Saitama (JP); Yoji Fujino, Kanagawa (JP); Someyoshi Arai, Tokyo (JP)

(73) Assignee: Nishiyama Corporation, Omorikita, Ota-ku: Tokyo (JP)

( * ) Notice: Subject to any disclaimer, the term of this patent is extended or adjusted under 35 U.S.C. 154(b) by 153 days.

(21) Appl. No.: 11/502,705

(22) Filed: Aug. 10, 2006

(65) Prior Publication Data

US 2007/0044504 A1    Mar. 1, 2007

(30) Foreign Application Priority Data

Sep. 1, 2005    (JP) ............................. 2005-253711

(51) Int. Cl.
*F25B 43/02* (2006.01)
(52) U.S. Cl. .............................. 62/471; 62/292; 62/476
(58) Field of Classification Search ............... 62/259.2, 62/292, 471, 474, 475, 476; 165/66, 104.33
See application file for complete search history.

(56) References Cited

U.S. PATENT DOCUMENTS

| 4,141,224 A | * | 2/1979 | Alger et al. ................. 62/50.1 |
| 4,897,762 A | * | 1/1990 | Daikoku et al. ............ 361/689 |
| 6,360,559 B1 | | 3/2002 | Midorikawa |

FOREIGN PATENT DOCUMENTS

| JP | 2001-050624 | 2/2001 |
| JP | 2002256970 | 9/2002 |

* cited by examiner

*Primary Examiner*—Melvin Jones
(74) *Attorney, Agent, or Firm*—Synnestvedt & Lechner LLP

(57) ABSTRACT

A cooling device includes a branch line with one end thereof communicating with a supplying line, and the other end communicating with a recovery line, wherein a part of the refrigerant supplied to the supplying line by a pump, flows as a branch; a heater installed in the middle of the branch line, for heating the refrigerant up to temperature higher than that for freezing moisture dissolving in the refrigerant; and a moisture adsorption filter installed in the middle of the branch line, through which the refrigerant heated by the heater passes, for adsorbing moisture mixed in the refrigerant.

6 Claims, 1 Drawing Sheet

COOLING DEVICE

This application is based on Japanese Patent Application No. 2005-253711 filed on Sep. 1, 2005, the contents of which are hereby incorporated by reference.

BACKGROUND OF THE INVENTION

1. Field of the Invention

The present invention relates to a cooling device.

2. Description of Related Art

In semiconductor producing equipment or semiconductor inspection equipment, and the like, cooling of an integrated circuit element is carried out by flowing a refrigerant, as a cooling liquid, while directly contacting with the integrated circuit element, as an object of cooling. In the case of cooling the integrated circuit element, moisture in the refrigerant has to be removed to prevent short circuit between end terminals. In a cooling device for supplying a refrigerant to an object of cooling which does not accept moisture, a moisture adsorption filter is equipped with to adsorb moisture being mixed and dissolved in the refrigerant (see JP-A-2001-50624). The cooling device includes a tank for storing the refrigerant, a pump for supplying the refrigerant to the object of cooling, and a heat exchanger for cooling the refrigerant returning from the object of cooling. The moisture adsorption filter includes an adsorbent, and is installed in the tank.

The cooling device is sometimes operated under the condition that temperature of the refrigerant to be supplied to the object of cooling becomes not higher than that for freezing the moisture dissolving in the refrigerant. Operation of the cooling device under such condition separates or release moisture, not able to dissolve, from the refrigerant, and converts the separated moisture to fine ice crystals, and thus suspends the crystals in the refrigerant. The moisture adsorption filter can not adsorb the moisture in the form of the ice crystals anymore. Therefore, the fine ice crystals formed in the refrigerant adhere to the heating transfer face of a heat exchanger, which consequently causes reduction of heat exchange efficiency of the heat exchanger. If the ice crystals adhesion to the heat exchanger develops more, cooling capacity is reduced, and resulting in continuous operation of the cooling device impossible.

BRIEF SUMMARY OF THE INVENTION

It is an object of the present invention to provide a cooling device for a moisture adsorption filter enabling to sufficiently adsorb moisture in a refrigerant, even when the system is operated under the condition that temperature of the refrigerant to be supplied to the object of cooling becomes not higher than that for freezing the moisture dissolving in the refrigerant, and allowing continuous operation thereof.

In an aspect of the present invention, a cooling device includes a supplying line for flowing a refrigerant to be supplied to an object of cooling, a recovery line for flowing the refrigerant returned from the object of cooling, a pump installed between the recovery line and the supplying line, for feeding the refrigerant into the supplying line, a heat exchanger installed in the middle of either the supplying line or the recovery line, for cooling the refrigerant to be supplied to the object of cooling, to temperature not higher than that for freezing the moisture dissolving in the refrigerant, a refrigerator for cooling the heat exchanger, a branch line with one end thereof communicating with the supplying line, and the other end communicating with the recovery line, wherein a part of the refrigerant supplied to the supplying line by the pump, flows as a branch, a heater installed in the middle of the branch line, for heating up the refrigerant to temperature higher than that for freezing the moisture dissolving in the refrigerant, and a moisture adsorption filter installed in the middle of the branch line, through which the refrigerant heated by the heater passes, for adsorbing moisture mixed in the refrigerant.

According to the above-mentioned cooling device, a part of the refrigerant sent to the supplying line from the pump, is taken into the branch line and heated up higher than temperature for freezing the moisture dissolving in the refrigerant. In this situation, as no fine ice crystal presents and the moisture is dissolved in the refrigerant, the moisture can efficiently be adsorbed by the moisture adsorption filter. Accordingly, moisture in a refrigerant can sufficiently be adsorbed by a moisture adsorption filter, and thus continuous operation thereof for a long period of time can be possible, even when the cooling device is operated under the condition that temperature of the refrigerant to be supplied to the object for cooling becomes not higher than that for freezing the moisture dissolving in the refrigerant.

Other objectives, features and advantages of the present invention will become apparent by referring to the following description and preferred embodiments described in an attached drawing.

DETAILED DESCRIPTION OF THE INVENTION

Figure 1:
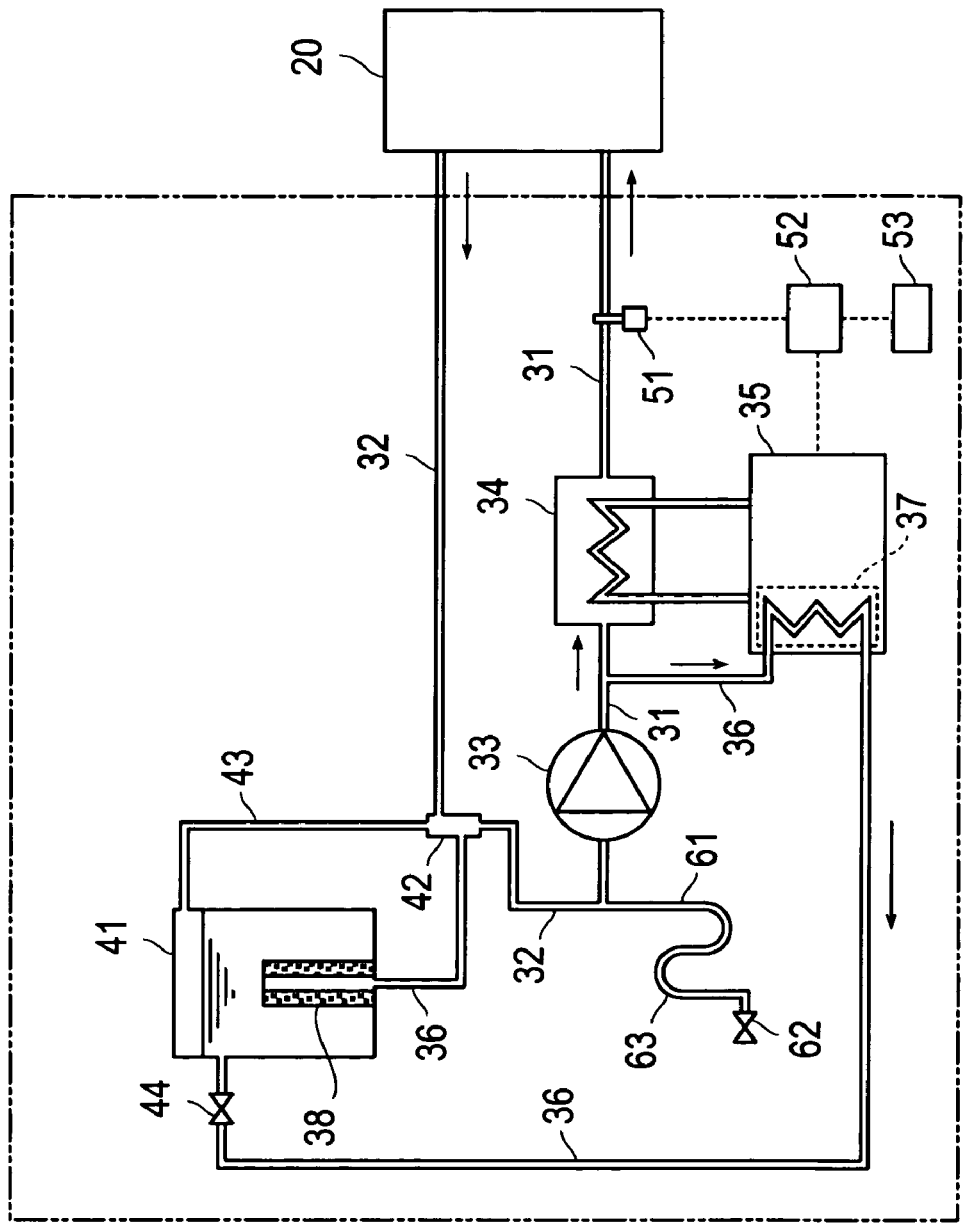
FIG. 1 is a general block diagram showing a cooling device relevant to the embodiment of the present invention.

A cooling device of the present invention is explained in detail based on a preferred embodiment shown in an attached drawing.

The cooling device 10 relevant to the embodiment of the present invention, is operated under the condition that temperature of the refrigerant supplied to an object of cooling 20 is not higher than that for freezing the moisture dissolving in the refrigerant. The object of cooling 20 includes, for example, an integrated circuit element in semiconductor producing equipment, or semiconductor inspection equipment, and the like.

As a general explanation, the cooling device 10 includes the supplying line 31 for flowing a refrigerant to be supplied to the object of cooling 20, the recovery line 32 for flowing the refrigerant returned from the object of cooling 20, the pump 33 installed between the recovery line 32 and the supplying line 31, for feeding the refrigerant into the supplying line 31, the heat exchanger 34 installed in the middle of the supplying line 31, for cooling the refrigerant to be supplied to the object of cooling 20, to temperature not higher than that for freezing the moisture dissolving in the refrigerant, the refrigerator 35 for cooling the heat exchanger 34, the branch line 36 with one end thereof communicating with the supplying line 31, and the other end communicating with the recovery line 32, wherein a part of the refrigerant supplied to the supplying line 31 by the pump 33, flows as a branch, the heater 37 installed in the middle of the branch line 36, for heating up the refrigerant to temperature higher than that for freezing the moisture dissolving in the refrigerant, and the moisture adsorption filter 38 installed in the middle of the branch line 36, through which the refrigerant heated by the heater 37 passes, for adsorbing moisture mixed in the refrigerant. Each line of 31, 32 and 36 is composed of pipes, fittings, valves, and the like.

The heater 37 heats the refrigerant by utilizing waste heat from the refrigerator 35. The refrigerator 35 is equipped with a compressor, an oil separator mounted at the pipeline at the delivery side of the compressor, a condenser for exhausting heat by cooling air sent from a fan, and the like. The heater 37 in the present embodiment is composed of a heat exchanger utilizing waste heat from the refrigerator 35. For example, a part of the branch line 36 is wound around the oil separator where temperature is relatively high, or a part of the branch line 36 is located at the area where cooling air with relatively high temperature flows after passing through the condenser.

The moisture adsorption filter 38 is composed of a moisture adsorbent located at the position where the refrigerant passes. As the moisture adsorbent, for example, silica gel or a molecular sieve is used. As silica gel changes color thereof when the moisture is adsorbed and thus moisture adsorbing capacity is lost, the timing of replacing silica gel can be determined. Accordingly installment of an inspection window at the moisture adsorption filter 38 is desirable, to see the color change of silica gel.

When the cooling device 10 is operated under the condition that temperature of the refrigerant to be supplied to the object of cooling 20, is not higher than that for freezing the moisture dissolving in the refrigerant, moisture, not able to dissolve, is separated or released from the refrigerant, and thus separated moisture floats in the refrigerant as fine ice crystals. The moisture adsorption filter 38 including the adsorbent can not adsorb the moisture in the form of the ice crystals anymore.

Therefore, in the present embodiment, a part of the refrigerant sent to the supplying line 31 from the pump 33 is thus taken into the branch line 36, and the refrigerant thus taken into is heated by the heater 37, up to temperature higher than that for freezing the moisture dissolving in the refrigerant. In this situation, as the moisture is dissolved in the refrigerant, the moisture can efficiently be adsorbed by the moisture adsorption filter 38.

Though temperature for freezing the moisture dissolving in the refrigerant is not simply decided because it depends on the type of a refrigerant or operation pressure, and the like, the inventors have obtained knowledge that the temperature is in a range of $-37°$ C. to $-0°$ C. (an operation pressure of $1.0$ kgf/cm$^2$) based on the operation results with a variety of cooling devices produced. In the present specification, "the temperature for freezing the moisture dissolving in the refrigerant" is not limited to the above-mentioned range of $-37°$ C. to $-0°$ C. (an operation pressure of $1.0$ kgf/cm$^2$), and there is the case that the moisture dissolving in the refrigerant freezes even at temperature other than the above temperature range. Therefore it should be understood that temperature for freezing the moisture dissolving in the refrigerant may differ depending on the type of a refrigerant or operation pressure, and the like.

In the present embodiment, the refrigerant taken into the branch line 36 is heated up to normal temperature by the heater 37 from the aspect of keeping the tank 41 to contain the refrigerant, as will be described below, at normal temperature, so as to eliminate cold insulation of the tank 41. Here, the "normal temperature" means temperature at which cold insulation on the tank 41 is unnecessary, and the "normal temperature" is between, for example, $+5°$ C. to $+25°$ C., and preferably $+5°$ C. to $+10°$ C.

The cooling device 10 further includes the temperature sensor 51 for detecting temperature of the refrigerant to be supplied to the object of cooling 20, to control temperature of the refrigerant to be supplied to the object of cooling 20, and the controller 52 for keeping temperature of the refrigerant to be supplied to the object of cooling 20, at specified temperature by controlling the output of the refrigerator 35 based on temperature detected by the temperature sensor 51. The controller 52 turns up the output of the refrigerator 35 to enhance cooling capacity of the heat exchanger 34, and lowers temperature of the refrigerant to be supplied to the object of cooling 20 to the preset temperature, when temperature of the refrigerant detected by the temperature sensor 51 is higher than the preset temperature. On the contrary, the controller 52 turns down the output of the refrigerator 35 to reduce cooling capacity of the heat exchanger 34, and raises temperature of the refrigerant to be supplied to the object of cooling 20 to the preset temperature, when temperature of the refrigerant detected by the temperature sensor 51 is lower than the preset temperature. As stated above, the controller 52 keeps temperature of the refrigerant to be supplied to the object of cooling 20 at specified temperature.

Replacement of the moisture adsorption filter 38 is required when moisture absorption capacity of an adsorbent in the moisture adsorption filter 38 deteriorates. In the case that moisture absorption capacity of the moisture adsorption filter 38 deteriorates, moisture not adsorbed adheres to the heat exchanger 34, as a form of ice, which is the lowest temperature location in the cooling device 10. With ice adhering, heat exchange efficiency goes down and cooling capacity of the heat exchanger 34 deteriorates. With the cooling capacity deterioration, the controller 52 controls the refrigerator 35 so as to raise the output as mentioned above. Accordingly, with monitoring the output of the refrigerator 35, namely monitoring change in a control signal output from the controller 52, and when the output of the refrigerator 35 increases, although heat load of the object of cooling 20 does not change, the moisture adsorption filter 38 is judged to have come to the timing to be replaced.

Therefore, the present embodiment includes the alerting unit 53 for alerting that the moisture adsorption filter 38 has come to the timing to be replaced. When the preset threshold concerning the output of the refrigerator 35 lasts for a preset period of time, the controller 52 judges that the moisture adsorption filter 38 has come to the timing to be replaced and activates the alerting unit 53, to send a message that the moisture adsorption filter 38 has come to the timing to be replaced. The alerting unit 53 can be composed of a display indicating the notice that the replacing timing has come, a printer printing a message that the replacing timing has come, a buzzer alerting the timing with sound, and the like. An appropriate value can be adopted for the preset threshold concerning the output of the refrigerator 35 and the preset lasting period of time. As an example, the threshold of the output is 90% of the maximum output of the refrigerator 35, and the lasting period of time is 2 hours.

In operation of the cooling device 10, the refrigerant sent to the supplying line 31 from the pump 33 is cooled by the heat exchanger 34 which is cooled by the refrigerator 35, and then supplied to the object of cooling 20. The refrigerant after cooling the object of cooling 20 flows again to the suction side of the pump 33 through the recovery line 32. For the sake of convenience in explanation, the refrigerant flow from the pump 33→the heat exchanger 34→the object of cooling 20→the pump 33 is referred to as a main circulating line.

In the cooling device 10 of the present embodiment, the tank 41 storing the refrigerant is located separately from the main circulating line. In more detail, the cooling device 10 additionally includes the tank 41 located in the middle of the branch line 36 for storing the refrigerant, the gas-liquid separator 42 located at the part where the branch line 36 communicates with the recovery line 32, and the gas-vent line 43 for sending the gas separated by the gas-liquid separator 42 back to the gas phase of the tank 41. The gas-vent line 43 is composed of pipelines, fittings and the like. The moisture adsorption filter 38 is located at the outlet hole, inside the tank 41, which is connected to the line communicating with the pump 33. Namely, the moisture adsorption filter 38 is located in the tank 41 so that the entire volume of the refrigerant sucked into the pump 33 may flow through the filter. When silica gel is used as an adsorbent of the moisture adsorption filter 38, installment of an inspection window at the tank 41 is desirable to see the color change of silica gel. The tank 41 includes a main body section with an opening at the top, and a cap section covering the opening. The cap section is bolt-fixed to the main body section so as to easily be detachable.

Furthermore the valve 44 for easily opening or closing the branch line 36 is installed at the upstream side of the moisture adsorption filter 38 in the branch line 36. In the present embodiment, the moisture absorption filer 38 is located in the tank 41, therefore, the valve 44 is located before the tank 41. Replacement of the moisture adsorption filter 38 is possible during operation of the cooling device 10, by closing the branch line 36 with the valve 44 shut-off. Furthermore, flow rate of the refrigerant, branched from the supplying line 31, can be adjusted by controlling the opening of the valve 44. Flow rate of the refrigerant, branched from the supplying line 31, is set to a certain flow rate so as not to practically affect cooling capacity of the cooling device 10. Flow rate of the refrigerant, branched from the supplying line 31, can also be controlled by an orifice installed in the supplying line 31.

By separating the tank 41 from the main circulating line, volume of the refrigerant contained in the tank 41 can be reduced. The amount of moisture which is able to dissolve in the refrigerant is proportional to the refrigerant volume held in the cooling device 10. With the result that the refrigerant volume contained in the tank 41 becomes small, and the refrigerant amount held in the cooling device 10 becomes small, the amount of moisture being able to dissolve in the refrigerant is reduced. Therefore even if a relatively compact-size moisture adsorption filter 38 is used, moisture mixed in the refrigerant can be adsorbed and removed. As the refrigerant volume held in the cooling device 10 becomes small, the time for the refrigerant to reach the preset temperature is significantly shortened.

By separating the tank 41 from the main circulating line, the tank 41 is not influenced by the preset temperature for operating the cooling device 10. Accordingly, even when the valve 44 is shut-off to replace the moisture adsorption filter 38 during operation of the cooling device 10, it does not influence temperature control of the cooling device 10.

As described above, because the refrigerant taken into the branch line 36 is heated up to normal temperature by the heater 37, the tank 41 can be kept at normal temperature. Because insulation material, and the like to implement cold-insulation of the tank 41 become unnecessary, installation space for the tank 41 is saved and consequently downsizing of the cooling device 10 can be realized. As temperature of the tank 41 is kept at normal temperature, it is not possible for moisture in the atmosphere to condense at the surface of the refrigerant, even if the cap section of the tank 41 is opened.

Because air mixed in the main circulating line or gas exhausted from the refrigerant during operation, is separated by the gas-liquid separator 42, stable operation of the pump 33 can be ensured. Furthermore, the gas-liquid separator 42 functions also as a buffer tank, and enables to enhance stability of temperature control.

The drain valve 62 is mounted at the recovery line 32 through the drain pipe 61. A U-trap 63 is mounted at a part of the drainpipe 61. Convection flow of the refrigerant in the drain pipe 61 communicating with the main circulating line, is blocked by the U-trap 63. Accordingly, even if temperature of the refrigerant in the main circulating line is low, there is no dew-condensation or freezing at the drain valve 62 and thus insulation material, and the like to implement cold-insulation of the drain valve 62 become unnecessary.

Next, the operation of the present embodiment will be explained.

Preset temperature of the refrigerant to be supplied to the object of cooling 20 is prescribed to be −55° C., for example. Opening degree of the valve 44 is adjusted in advance so that flow rate of the refrigerant flowing back to the tank 41 is set at a certain flow rate not to practically affect cooling capacity of the cooling device 10.

When operation of the cooling device 10 starts, as temperature of the refrigerant detected by temperature sensor 51 is higher than the preset temperature, the controller 52 increases the output of the refrigerator 35 to enhance cooling capacity of the heat exchanger 34, and lowers temperature of the refrigerant to be supplied to the object of cooling 20 down to the preset temperature. The refrigerant with the same volume as that of the refrigerant taken into the branch line 36, flows from the tank 41 to the recovery line 32. Because the tank 41 is separated from the main circulating line, the refrigerant volume contained in the tank 41 can be reduced, and with the result that the refrigerant volume held in the cooling device 10 is lowered, moisture mixed in the refrigerant can be adsorbed and removed, even if the relatively compact size moisture adsorption filter 38 is used. Furthermore, as the refrigerant volume held in the cooling device 10 becomes small, the time for the refrigerant to reach the preset temperature is significantly shortened, and after the cooling device 10 is started, the refrigerant cooled to the preset temperature can quickly be provided to the object of cooling 20.

When steady state is attained, the controller 52 keeps temperature of the refrigerant to be supplied to the object of cooling 20 to preset temperature, by controlling the output of the refrigerator 35, based on temperature detected by temperature sensor 51.

A part of the refrigerant sent to the supplying line 31 from the pump 33 is taken into the branch line 36, and heated up to normal temperature (for example, +25° C.) by the heater 37 and then sent back to the tank 41. When the refrigerant is kept at normal temperature, fine ice crystals do not present and moisture is dissolved in the refrigerant. Therefore moisture can efficiently be adsorbed at the moisture adsorption filter 38. Accordingly, even if the cooling device 10 is operated under the condition that temperature of the refrigerant to be supplied to the object of cooling 20 becomes not higher than that for freezing the moisture dissolving in the refrigerant, the moisture in the refrigerant at the moisture adsorption filter 38 can sufficiently be adsorbed and a continuous operation for a long period of time can be attained.

In operation, the controller 52 monitors the output of the refrigerator 35, namely change in the control signal of the output. And the controller 52 judges that the moisture adsorption filter 38 has come to the timing to be replaced, when the preset threshold concerning the output of the refrigerator 35 (for example, 90% of the maximum output of the refrigerator 35) lasts for the preset period of time (for example, 2 hours). Then the controller 52 activates the alerting unit 53 to indicate the message on a display or others that the moisture adsorption filter 38 has come to the timing to be replaced and to alert a user.

The user closes the valve 44, opens the cap section of the tank 41 and replaces the moisture adsorption filter 38. Even if the valve 44 is closed during operation of the cooling device 10, temperature control of the cooling device 10 is not affected, as the tank 41 is separated from the main circulating line. And because the tank 41 is kept at normal temperature, it is not possible for moisture in the atmosphere to condense at the surface of the refrigerant, even if the cap of the tank 41 is opened. After the replacement of the moisture adsorption filter 38 is finished, the valve 44 is opened to return to normal operation.

Because the tank 41 is kept at normal temperature, insulation material, and the like to implement cold-insulation of the tank 41 become unnecessary, and the downsizing of the cooling device 10 can be realized. In addition, because the U-trap 63 is mounted at a part of the drainpipe 61, it is unlikely that the drain valve 62 is cooled, even if temperature of the refrigerant in the main circulating line is low, and thus insulation material, and the like to implement cold-insulation of the drain valve 62 become unnecessary.

As explained above, the cooling device 10 of the present embodiment includes the branch line 36 with one end thereof communicating with the supplying line 31, and the other end communicating with the recovery line 32, wherein a part of the refrigerant supplied to the supplying line 31 by the pump 33, flows as a branch, the heater 37 installed in the middle of the branch line 36, for heating up the refrigerant to temperature higher than that for freezing the moisture dissolving in the refrigerant, and the moisture adsorption filter 38 installed in the middle of the branch line 36, through which the refrigerant heated by the heater 37 flows, for adsorbing moisture mixed in the refrigerant, therefore, even if the cooling device 10 is operated under the condition that temperature of the refrigerant to be supplied to the object of cooling 20 becomes not higher than that for freezing the moisture dissolving in the refrigerant, the moisture in the refrigerant at the moisture adsorption filter 38 can sufficiently be adsorbed, and consequently the reliable cooling device 10 enabling a continuous operation for a long period of time can be provided.

Furthermore, the alerting unit 53 is included to alert that the moisture adsorption filter 38 has come to the timing to be replaced, and when the preset threshold concerning the output of the refrigerator 35 lasts for the preset period of time, the controller 52 judges that the moisture adsorption filter 38 has come to the timing to be replaced and activates the alerting unit 53 to send a message that the moisture adsorption filter 38 has come to the timing to be replaced. Therefore, the timing to replace the moisture adsorption filter 38 can easily and correctly be known.

As the heater 37 heats the refrigerant by utilizing waste heat from the refrigerator 35, the cooling device 10 not consuming unnecessary energy can be provided.

As the heater 37 heats the refrigerant taken into the branch line 36 up to normal temperature, insulation material, and the like to implement cold-insulation along the branch line 36 (including the tank 41) become unnecessary, installation space for the branch line 36 is saved and consequently downsizing of the cooling device 10 can be realized.

As the cooling device 10 additionally includes the tank 41 located in the middle of the branch line 36, for storing the refrigerant, the gas-liquid separator 42 located at the part where the branch line 36 communicates with the recovery line 32, and the gas-vent line 43 for sending gas separated in the gas-liquid separator 42 back to the gas phase of the tank 41, the tank 41 can be separated from the main circulating line, which in turn enables to reduce the refrigerant volume in the tank 41. As a result of being able to reduce the refrigerant held in the cooling device 10, moisture dissolving in the refrigerant is reduced. Therefore, even if a relatively compact size moisture adsorption filter 38 is used, moisture mixed in the refrigerant enables to be adsorbed and removed. And time for the refrigerant to reach the preset temperature is significantly shortened, and after the cooling device 10 is started, the refrigerant cooled to the preset temperature can quickly be provide to the object of cooling 20.

As the cooling device 10 additionally includes the valve 44 installed at the upstream side of the moisture adsorption filter 38 in the branch line 36, for easily opening or closing the branch line 36, replacement of the moisture adsorption filter 38 is possible during operation of the cooling device 10, by closing the branch line 36.

MODIFIED EXAMPLES

The embodiment wherein the heat exchanger 34 is located in the middle of the supplying line 31 is illustrated, however, the heat exchanger 34 can also be located in the middle of the recovery line 32.

The type or construction of the heater 37 is not especially limited, as long as it is such one as enables to heat the refrigerant flowing in the branch line 36 up to temperature higher than that for freezing the moisture dissolving in the refrigerant. The heater 37 may be composed of an electric heater, a heat adsorbing fin, and the like.

A Pre-Production Example

The moisture adsorption filter 38 was installed in the tank 41 so that the entire volume of the refrigerant sucked into the pump 33 may pass through the moisture adsorption filter 38. The tank 41 with a refrigerant containing volume of 4 liters was used. The gas-liquid separator 42 was cylindrical in shape with an inside diameter of 40 mm and a height of 150 mm so that the refrigerant flow velocity was not higher than 15 cm/sec. The heater 37 was composed of a heat exchanger utilizing waste heat from the refrigerator 35, and a small copper tube with an outside diameter of 3 mm composing a part of the branch line 36 was wound on an oil separator, and further a part of the branch line 36 was located at the place where cooling air passed at relatively high temperature after passing through a condenser. An orifice with an inside diameter of 0.5 mm and a length of 5 mm was installed in the branch line 36, and the valve 44 was installed before the tank 41 in the branch line 36. Temperature of the refrigerant to be supplied to the object of cooling 20 was preset to −55° C. Circulating flow rate of the refrigerant in the branch line 36 mounted with the orifice was 30 milliliter/min and the refrigerant was heated up to +25° C. after passing through the heater 37. The refrigerant at this temperature was returned to the tank 41.

In the cooling device 10 of the pre-production example, actual cooling capacity at a temperature −55° C. was 750 W. Heat loss for heating the refrigerant from −55° C. to +25° C. was calculated to be approximately 70 W.

10 milliliter of water was supplied to the tank 41 while the cooling device 10 was operated at a temperature of −55° C. without mounting the moisture adsorption filter 38. After the water, floating at the surface of the refrigerant, was dissolved in the refrigerant, the moisture adsorption filter 38 was mounted in the tank 41, and the cooling device was continuously operated and the control output of the controller 52 was monitored. When the moisture adsorption filter 38 was mounted, the control output of the controller 52 was 80%. After a continuous operation for a week, the control output of the controller 52 went down to 60%. The operation state with a control output of 60% was that when the refrigerant was dry. Therefore it was confirmed that the moisture being mixed in the refrigerant and got mixed during operation was sufficiently adsorbed by the moisture adsorption filter 38, even if the cooling device is operated at low temperature.

In the drain pipe 61 with a line length of roughly 40 cm, the U-trap 63 with a length of 8 cm was formed. Surface temperature of the drain valve 62 was 25° C. even after the cooling device 10 was operated for not shorter than 1 week. Accordingly, cold insulation on the drain valve 62 was confirmed to be eliminated by installment of the U-trap 63.

The present invention is by no means limited to the embodiments above, and may naturally be altered and/or modified variously without departing from the technical concept of the present invention.

What is claimed is:

1. A cooling device comprising:
    a supplying line for flowing a refrigerant to be supplied to an object of cooling;
    a recovery line for flowing the refrigerant returned from the object of cooling;
    a pump installed between the recovery line and the supplying line, for feeding the refrigerant into the supplying line;
    a heat exchanger installed in the middle of either the supplying line or the recovery line, for cooling the refrigerant to be supplied to the object of cooling, to temperature not higher than that for freezing the moisture dissolving in the refrigerant;
    a refrigerator for cooling the heat exchanger;
    a branch line with one end thereof communicating with the supplying line, and the other end communicating with the recovery line, wherein a part of the refrigerant supplied to the supplying line by the pump, flows as a branch;
    a heater installed in the middle of the branch line, for heating up the refrigerant to temperature higher than that for freezing the moisture dissolving in the refrigerant; and
    a moisture adsorption filter installed in the middle of the branch line, through which the refrigerant heated by the heater passes, for adsorbing moisture mixed in the refrigerant.

2. The cooling device according to claim 1, additionally comprising:
    a temperature sensor for detecting temperature of the refrigerant to be supplied to the object of cooling;
    a controller for keeping temperature of the refrigerant to be supplied to the object of cooling, at specified temperature by controlling the output of the refrigerator based on temperature detected by the temperature sensor; and
    an alerting unit for alerting that the moisture adsorption filter has come to the timing to be replaced, wherein, when the preset threshold concerning the output of the refrigerator lasts for a preset period of time, the controller judges that the moisture adsorption filter has come to the timing to be replaced, and activates the alerting unit, to send a message that the moisture adsorption filter has come to the timing to be replaced.

3. The cooling device according to claim 1, wherein the heater heats up the refrigerant by utilizing waste heat from the refrigerator.

4. The cooling device according to claim 1, wherein the heater heats up the refrigerant taken into the branch line to normal temperature.

5. The cooling device according to claim 1 additionally comprising:
    a tank located in the middle of the branch line for storing the refrigerant;
    a gas-liquid separator located at the part where the branch line communicates with the recovery line; and
    a gas-vent line for sending the gas separated by the gas-liquid separator back to the gas phase of the tank.

6. The cooling device according to claim 1, additionally comprising a valve for easily opening or closing the branch line, installed at the upstream side of the moisture adsorption filter in the branch line.

* * * * *